United States Patent
Lee et al.

(10) Patent No.: US 7,732,298 B2
(45) Date of Patent: Jun. 8, 2010

(54) METAL SALICIDE FORMATION HAVING NITRIDE LINER TO REDUCE SILICIDE STRINGER AND ENCROACHMENT

(75) Inventors: Tan-Chen Lee, Panchiao (TW); Chung-Te Lin, Hsinchu (TW); Kuang-Hsin Chen, Jung-Li (TW); Chi-Hsi Wu, Hsinchu (TW); Di-Houng Lee, Austin, TX (US); Cheng-Hung Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 11/669,870

(22) Filed: Jan. 31, 2007

(65) Prior Publication Data

US 2008/0179689 A1   Jul. 31, 2008

(51) Int. Cl.
*H01L 21/76* (2006.01)
(52) U.S. Cl. .............. 438/426; 257/384; 257/E21.438; 257/E21.439
(58) Field of Classification Search .......... 257/E21.438, 257/E21.439, 384; 438/426
See application file for complete search history.

(56) References Cited

U.S. PATENT DOCUMENTS

| 5,981,383 | A | * | 11/1999 | Lur et al. ............... 438/655 |
| 6,004,878 | A | | 12/1999 | Thomas et al. |
| 6,063,681 | A | * | 5/2000 | Son .................... 438/303 |
| 6,242,354 | B1 | | 6/2001 | Thomas |
| 6,265,271 | B1 | * | 7/2001 | Thei et al. ............. 438/296 |
| 6,339,018 | B1 | * | 1/2002 | Ballantine et al. ...... 438/586 |
| 6,683,356 | B2 | * | 1/2004 | Tsuchiaki ............. 257/412 |
| 6,777,759 | B1 | | 8/2004 | Chau et al. |
| 7,084,061 | B2 | * | 8/2006 | Sun et al. ............. 438/685 |
| 7,118,954 | B1 | * | 10/2006 | Lin et al. ............. 438/201 |
| 2002/0022366 | A1 | | 2/2002 | Cabral, Jr. et al. |
| 2002/0053711 | A1 | * | 5/2002 | Chau et al. ........... 257/412 |
| 2003/0183881 | A1 | * | 10/2003 | Lee et al. ............. 257/382 |
| 2003/0209765 | A1 | | 11/2003 | Lee et al. |
| 2005/0048731 | A1 | * | 3/2005 | Patton et al. .......... 438/304 |
| 2006/0145270 | A1 | * | 7/2006 | Choi ................... 257/384 |
| 2007/0075379 | A1 | * | 4/2007 | Wu et al. ............. 257/384 |

\* cited by examiner

*Primary Examiner*—David Vu
*Assistant Examiner*—Brandon Fox
(74) *Attorney, Agent, or Firm*—Baker & McKenzie LLP

(57) ABSTRACT

Disclosed herein are various embodiments of techniques for preventing silicide stringer or encroachment formation during metal salicide formation in semiconductor devices. The disclosed technique involves depositing a protective layer, such as a nitride or other dielectric layer, over areas of the semiconductor device where metal silicide formation is not desired because such formation detrimentally affects device performance. For example, silicon particles that may remain in device features that are formed through silicon oxidation, such as under the gate sidewall spacers and proximate to the perimeter of shallow trench isolation structures, are protected from reacting with metal deposited to form metal silicide in certain areas of the device. As a result, silicide stringers or encroachment in undesired areas is reduced or eliminated by the protective layer.

18 Claims, 3 Drawing Sheets

METAL SALICIDE FORMATION HAVING NITRIDE LINER TO REDUCE SILICIDE STRINGER AND ENCROACHMENT

TECHNICAL FIELD

Disclosed embodiments herein relate generally to the manufacture of semiconductor devices, and more particularly to semiconductor devices and related methods of manufacturing having a protective layer for decreased silicide stringer or encroachment during metal salicide formation.

BACKGROUND

As technology in products and equipment continues to become more complex, the use of integrated circuit (IC) devices in these products and equipment is basically essential. In addition, consumers and manufacturers alike have continued to desire smaller product size, which requires a continued decrease in overall IC chip size. As a result, the large-scale integration of circuit components, such as transistors and capacitors, has become a necessity for decreased overall size, but increased device performance. Thus, semiconductor device improvements have been largely accomplished by reducing device feature size to the point where currently micron and sub-micron device features are being used, and predictions for future device sizes do not foresee an end to the trend of ever smaller and denser devices.

Along with desired reductions in device size, and thus increased chip densities, comes a required reduction in device power consumption that imposes the use of decreased device feature lengths. This is because, as a general rule, device speed varies inversely with device feature length, while power consumption increases approximately with the square of the device feature length. Thus, feature sizes currently being employed are in the micron and sub-micron or 0.13 um range where it is expected that the feature size of 0.65 nm will become a common in the near future.

Field Effect Transistors (FETs) are at this time used extensively in Ultra Large-Scale Integration (ULSI) applications. FETs are formed using gate electrodes, usually made of polysilicon, over a gate oxide, and adjacent source/drain regions surrounding the gate oxide to define the channel of the device. Silicides are typically employed in the source/drain regions, and over the gate electrode, to improve the electrical connection between the parts of the transistor and metal interconnects dispersed throughout the IC chip to connect circuit components. These contact pads are typically comprised of a metal silicide formed by reacting a deposited metal with the silicon it is deposited over.

Metal silicide has been employed to provide the electrical contact between parts of the semiconductor devices and these metal interconnects primarily because of the reduced contact resistance and sheet resistance provided by metal silicide. Self-Aligned metal silicide contact structures, commonly referred to as "salicide" structures, are often used in the formation of Metal Oxide Semiconductor (MOS) transistor structures to minimize contact resistance. In one known salicide process for a MOS transistor, source and drain regions are formed aligned to a gate electrode structure and/or any sidewall spacers that may be present. A blanket metal layer is deposited so that silicon, at the upper surface of source, drain and gate regions, is in contact with the metal. The wafer is then heated ("annealed") to a temperature to undergo a reaction and form a metal silicide. The sidewall spacers serve to prevent bridging of the gate silicide region with either the source or drain silicide regions. When no silicon is available from the sidewall spacers or other areas of the device structure, no silicide forms thereon. After the metal silicide is formed, the unreacted metal is then removed, and regions of metal silicide are revealed. After removal of the metal not reacted to form a silicide, a second, higher temperature silicide anneal step is often employed to stabilize the silicide regions formed and to provide the lowest possible silicide resistivity.

However, as device geometries become smaller, the separation (spacing) between devices also becomes smaller. As a result, salicide "stringers" become an increasingly serious problem. Specifically, stringers can form at the corner of the sidewall spacers and the salicide source/drain areas if RF sputtering is employed in the pre-salicidation cleaning process, and can detrimentally affect device performance. For example, as active regions are formed closer together to improve device spacing, and thus the isolation regions, such as shallow trench isolation (STI) structures, are made more compact (e.g., less than 0.2 microns wide), silicide stringers from adjacent source/drain regions might be connected at the STI structures, and therefore cause salicide short-circuits between adjacent devices. While alternative pre-clean methods may be employed, such processes often require expensive, dedicated equipment. While some process alterations or optimization can help alleviate the stringer problem, often stringer formation cannot be eliminated through such means, and yield loss results from electrical problems caused by such stringers.

Another problem with conventional processes is that such semiconductor device structures are vulnerable to silicide "encroachment." More specifically, silicide encroachment can result in short-circuiting between source/drain regions and the well. Additionally, encroachment can occur under the sidewall spacers and into the spacer oxide liner over the source/drain and channel regions, particularly when an oxide undercut at the base of the sidewall spacers and/or on top of the STI are formed before salicide formation. Regardless of how a silicide stringer or encroachment occurs, the result is typically leakage in corresponding areas of the semiconductor device(s), and often short-circuiting of the device(s) as discussed above. Accordingly, what is needed are techniques for forming salicide regions on semiconductor devices, while reducing or eliminating silicide stringer and/or encroachment.

SUMMARY

Disclosed herein are various embodiments of techniques for preventing silicide stringer or encroachment formation during metal salicide formation in semiconductor devices. The disclosed technique involves depositing a protective layer, such as a nitride or other dielectric layer, over areas of the semiconductor device where metal silicide formation is not desired because such formation detrimentally affects device performance. For example, excess Si surface/residue exposed outside the dielectric layer coverage due to spacer liner oxide undercut or STI loss during process, is protected from reacting with metal deposited to form metal silicide in certain areas of the device. As a result, silicide stringers or encroachment in undesired areas is reduced or eliminated by the protective layer when the salicidation occurs.

In one embodiment, a method of manufacturing a semiconductor device in accordance with the disclosed techniques includes forming device features on a semiconductor substrate, depositing a protective layer over the device features, and removing portions of the protective layer to expose at least one of the device features while leaving the remaining device features covered. In addition, such a method also includes depositing a metal layer over the at least one exposed device feature and remaining portions of the protective layer, and forming a metal silicide in the at least one exposed device feature by reacting portions of the metal layer with silicon in the exposed device feature. During metal silicide formation, the protective layer prevents portions of the metal layer from reacting with silicon in the covered device features. In addition, this embodiment of the method also includes removing non-reacted portions of the metal layer after silicide formation.

In another embodiment, a semiconductor device constructed according to the disclosed principles comprises device features formed on a semiconductor substrate, and a protective layer exposing at least one of the device features and covering the remaining device features. In addition, such a semiconductor device comprises metal silicide formed in the at least one exposed device feature by silicon located therein reacting with a deposited metal, wherein the protective layer isolates the covered device features from the deposited metal. The protective layer prevents any silicon present in the covered device features from reacting with the deposited metal, and thus keeps metal silicide from forming in those protected areas.

BRIEF DESCRIPTION

For a more complete understanding of the principles disclosed herein, and the advantages thereof, embodiments are illustrated by way of example in the following figures in which like reference numbers indicate similar parts, and in which.

DETAILED DESCRIPTION

Figure 1:
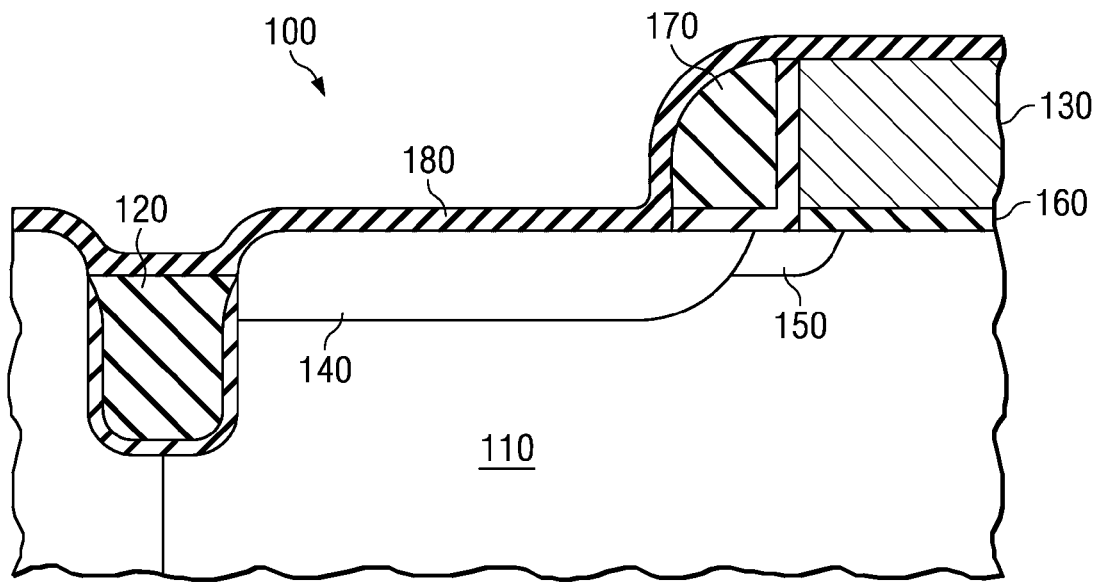
FIG. 1 illustrates one embodiment of a semiconductor device undergoing a manufacturing process according to the principles disclosed herein.

FIG. 1 illustrates one embodiment of a semiconductor device 100 constructed according to the principles disclosed herein. The semiconductor device 100 is formed on a semiconductor substrate 110, which may be constructed from bulk silicon, silicon germanium, or may be a silicon-on-insulator (SOI) substrate. Separating active regions on the substrate 110 are isolation regions 120 (only one is illustrated), which in this embodiment have been formed as a shallow trench isolation (STI) structure 120 using conventional techniques. As is typically the case with today's processes, the numerous processing steps often result in the STI structures 120 becoming recessed below the upper surface of the substrate 110. This is particularly the case if an oxide under cut process is used on the STI structure 120. The encroachment problems that often occur with recessed STI structures are discussed in greater detail below.

In the illustrated embodiment of FIG. 1, the semiconductor device 100 is a metal-oxide-semiconductor (MOS) transistor device 100, which includes a gate electrode 130 formed on the substrate 110. The gate electrode 130 may be formed using polysilicon through conventional techniques; however, other materials may also be employed. Also constructed as part of the MOS transistor device 100 are a source/drain region 140 and a lightly-doped drain (LDD) region 150. Both of these components of the device 100 may also be formed using conventional doping techniques.

The device 100 also includes a gate oxide 160 formed under the gate electrode 130 and over the channel region defined between the LDDs 150 (only one LDD 150 is shown). In addition, dielectric (e.g., nitride or oxynitride) sidewall spacers 170 (only one is illustrated) have been formed on the sides of the gate electrode 130, to electrically insulate the gate electrode 130 during device operation. Then, in accordance with the disclosed principles, a protective dielectric layer 180 is shown deposited over the entire structure of the device 100, as well as over the STI structure 120. In this embodiment, the protective layer 180 is a nitride layer 180 that has been deposited over the area before salicide regions (discussed below) have been formed on the device 100. In other embodiments, however, the protective layer 180 may be an oxide and/or oxynitride layer.

Figure 2:
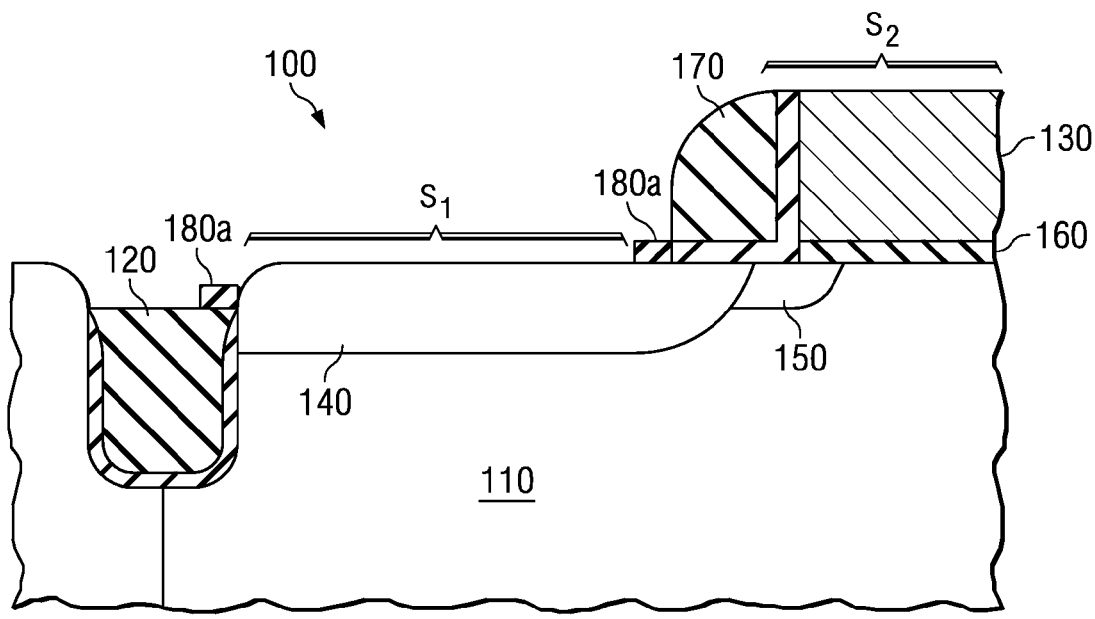
FIG. 2 illustrates the semiconductor device of FIG. 1 further along in the manufacturing process.

FIG. 2 illustrates the semiconductor device 100 of FIG. 1, but further along in the manufacturing process. In accordance with the disclosed principles, the protective layer 180 is deposited over the device 100 structure prior to formation of the metal salicide regions in order to reduce or eliminate the metal silicide stringers and encroachment discussed above that may form in the device 100 during salicide formation. Specifically, the protective layer 180 deposited over the semiconductor device 100 is selected as a material that will not react with silicon and metal layer present in the composition of certain portions of the device 100. For example, the protective layer 180 is selected (e.g., nitride, oxide, oxynitride, etc.) so as not to react with the metal layer typically used to form the salicide at source/drain regions 140 and gate electrode 130 of the transistor device 100. In addition, the protective layer 180 may be formed to a thickness of about 30 Å to 300 Å, although no particular thickness is required, so long as the protection of certain areas of the device 100 is provided as disclosed herein.

After depositing the protective layer 180, a dry etch may be performed to remove specific portions of the protective layer 180 and thus expose areas $S_1$, $S_2$ of the device 100, which will have salicide regions formed therein. To etch the protective layer 180, any conventional technique where the etching parameters may be carefully controlled may be employed. More specifically, vertical and horizontal control of the dry etch process is carefully managed so that openings in only the desired areas of the protective layer 180 are formed. Regardless of the type of removal technique employed, portions of the protective layer 180 are left in (and therefore protecting) specific areas of the device 100 that are often subject to silicide stringer formation and/or encroachment. This protection is discussed in further detail below, with reference to the formation of the salicide regions. Moreover, although the remaining portions 180a of the protective layer 180 are illustrated as block-shaped, it should be understood that these portions 180a may take on any shape, while still providing the protection described herein.

Figure 3:
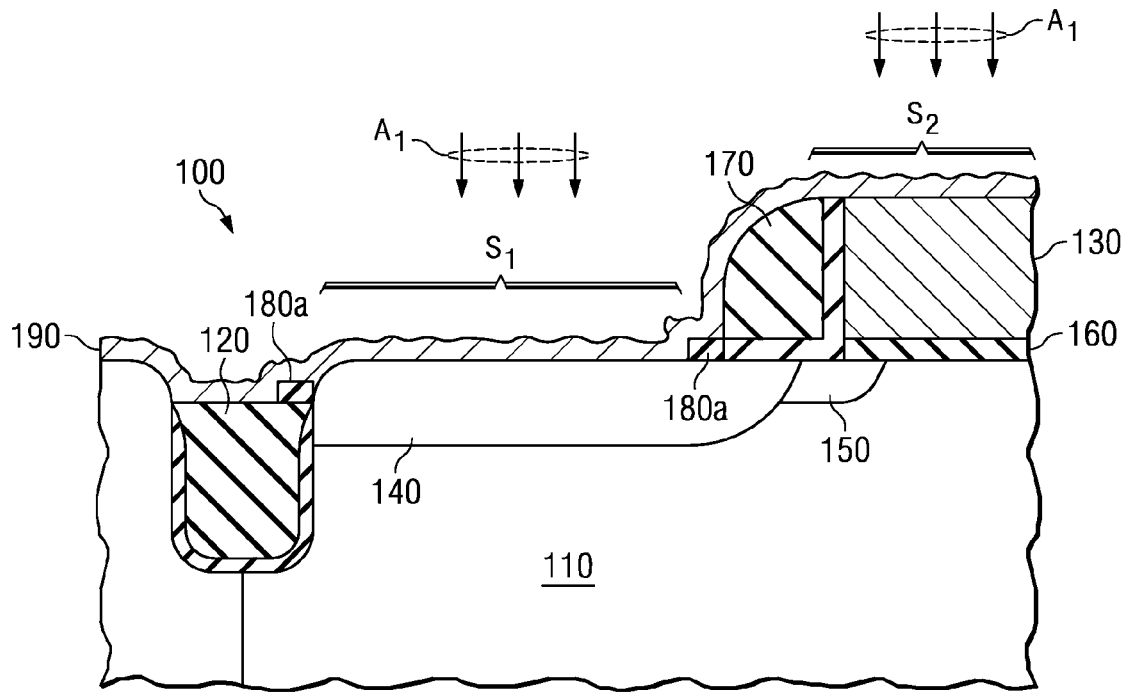
FIG. 3 illustrates the semiconductor device illustrated in FIG. 2 later in the manufacturing process and early in the formation of metal salicide areas.

FIG. 3 illustrates the semiconductor device 100 illustrated in FIG. 2 later in the manufacturing process and early in the formation of metal salicide regions. To form the metal salicide regions, a metal layer or film 190 has first been deposited over the entire area. As discussed above, the composition of the metal layer 190 is typically selected so that it will react with the silicon present in the device structure and surrounding areas to form metal silicide. In exemplary embodiments, the metal layer 190 is comprised of nickel, cobalt, titanium, tantalum, tungsten, palladium or any other metal and alloy that is capable of reacting with portions of the device structure to form a metal silicide. Specific examples include nickel alloys, such as nickel platinum, and titanium alloys, such as titanium cobalt. Therefore, in preferred embodiments of the device 100, the metal silicide that is formed may be nickel silicide, cobalt silicide, titanium silicide, tantalum silicide, palladium silicide or tungsten silicide. Of course, other types of metal silicide may also be created, and no limitation to any particular silicide composition is intended or should be implied or inferred.

As in conventional salicide formation techniques, the metal layer 190 is blanket deposited over the source/drain region 140, the gate electrode 130, and also on the remaining portions 180a of the protective layer 180. A first rapid thermal anneal (RTA), as indicated by arrows $A_1$, is then performed on the device 100 to cause the deposited metal layer 190 to react with silicon molecules present in areas in contact with the metal layer 190 in order to form metal silicide. In exemplary embodiments, the first RTA is performed at a temperature of about 200° C.-400° C. for a time period of about a few seconds to a few minutes. Of course, other temperatures and time periods may also be employed that are beneficial to the formation of metal silicide on the device 100.

Figure 4:
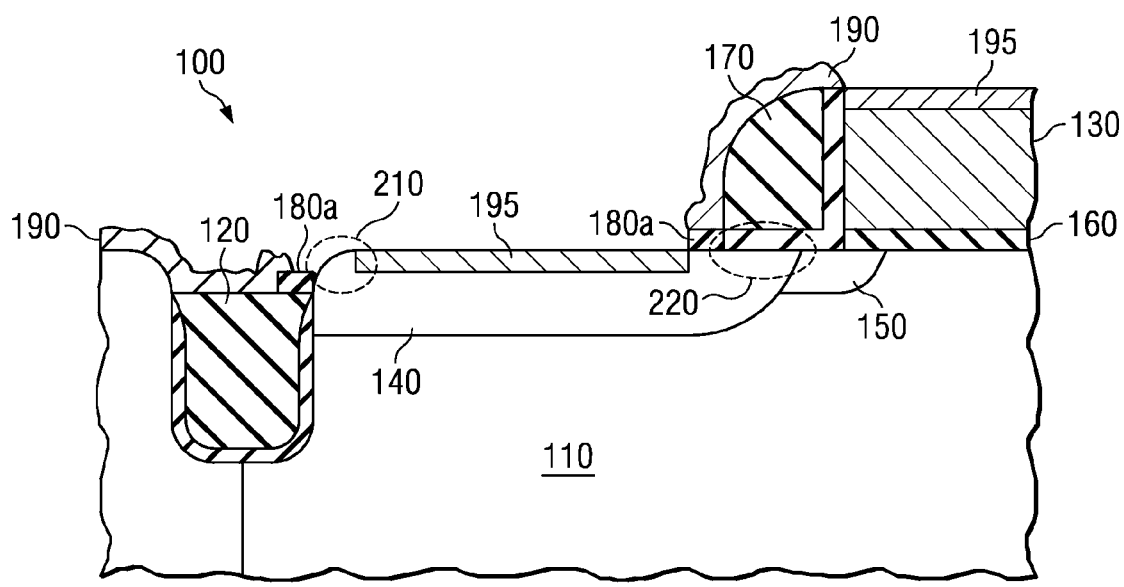
FIG. 4 illustrates the semiconductor device illustrated in FIG. 3 after the metal salicide areas have been formed.

FIG. 4 illustrates the semiconductor device illustrated in FIG. 3 after the metal salicide areas have been formed. More specifically, after the first RTA performed with reference to FIG. 3, metal salicide regions 195 are formed in the source/drain region 140, as well as in the gate electrode 130. The metal salicide regions 195 are formed by the reaction of the metal layer 190 with silicon in the source/drain region 140 and in the gate electrode 130 and the reacted portions have resulted in metal silicide being formed in desired areas of the device 100. These metal silicide regions 195 form the 'salicide' areas for the device 100. Interconnects (not illustrated) may then be formed through interlevel dielectric layers formed over the device 100, and those interconnects may be formed in electrical contact with the salicide 195 pads to provide electrical signals to the device 100.

In addition, in accordance with the disclosed principles, the portions 180a of the protective layer 180 that remain over certain portions of the device 100 structure after the dry etch performed above serve to protect areas of the structure that typically suffer from silicide stringers and/or silicide encroachment occurring during salicide formation that may affect device performance. One specific area protected by the portions 180a is area 210 of the substrate 110 that is exposed at the perimeter of the recessed STI structure 120.

The typical processing steps results in the corner of the STI structure 120 becoming recessed below the top surface of the substrate 110. In conventional approaches, when the salicide regions 195 are formed, the deposited metal 190 intended to react with the silicon in the desired areas (e.g., the source/drain regions 140 and the gate electrode 130) may inadvertently react with these areas 210 of the substrate 110, thus allowing the excess metal silicide to form over the STI corner 120 (deep salicide formation or encroachment). Such encroachment occurs when metal used to form the metal silicide diffuses from the top of STI to the exposed Si corner. This might cause junction leak and device failure.

Another area of the device 100 structure that may be protected by the remaining portions 180a of the protective layer 180 illustrated in FIG. 4 is the dielectric (e.g., nitride or oxynitride) sidewall spacers 170 formed along the sides of the gate electrode 130. As discussed above, encroachment may occur under the sidewall spacers 170 due to metal 190 inadvertently reacting with silicon in the area 220 under the spacers and proximate to the oxide liner under the gate structure. During silicide formation, portions of the metal layer 190 may react with silicon in certain areas 220 of the source/drain region 140 under the gate sidewall spacer 170, particularly when an oxide undercut results from the process in the area 220. As discussed above, when such stringers are present, adjacent active areas separated by the recessed STI structure 120 may electrically contact each other, which of course affects device performance. This problem has become even more prevalent as the chip densities continue to increase, and thus the separation between adjacent devices consequently decreases.

However, in accordance with the principles disclosed herein, the remaining portions 180a of the protective layer 180 proximate to this area 220 of the device 100 serves to resist or prevent such silicide encroachment and/or stringer issues. Thus, to address the problems of stringers and encroachment, these portions 180a are left protecting this area 220 so that silicon will not inadvertently react with the metal layer 190. Furthermore, if an oxide undercut is performed on the device 100, the remaining protective portions 180a serve to "fill in" the undercut portions in order to reduce or prevent exposure of portions of the substrate 110 in the area 220 near the corner of the sidewall spacer 170, and thus reduce or prevent metal diffusion under the sidewall spacer 170 during the salicidation process.

Figure 5:
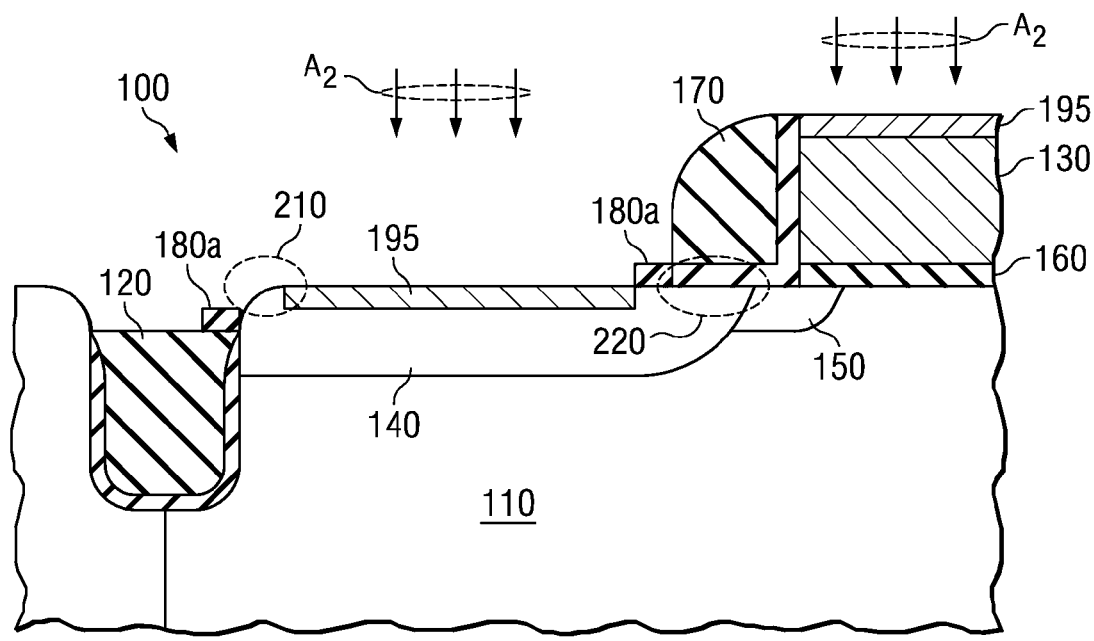
FIG. 5 illustrates the completed semiconductor device after the manufacturing process disclosed herein.

FIG. 5 illustrates the completed semiconductor device 100 after one embodiment of the manufacturing process disclosed herein. Once the metal layer 190 has reacted with silicon in the appropriate areas to form the salicide regions 195, as discussed with reference to FIG. 4, a removal step may then be performed on the device 100. For example, an etching process may be performed on the device 100 to remove portions of the metal layer 190 that did not react with silicon found in the device 100 layout.

After etching portions of the metal layer 190 that have not reacted with silicon-based device features, a second RTA step may be performed, a shown by arrows $A_2$. The second RTA step finalizes the formation of the salicide pads 195 in the device 100 structure and stabilizes the metal silicide therein. As shown in FIG. 5, the protective portions 180a of layer 180 protect areas 210, 220 of the device 100 that typically suffer from silicide stringers and/or encroachment. As a result, the leakage associated with silicide stringers and encroachment in these areas can be mitigated or avoided altogether in these critical areas 210, 220 of the device 100. Of course, the formation and removal of the protective layer 180 may be tailored to protect any desired portion of the semiconductor device 100, and no limitation to the protection of any single area of the device 100 from silicide stringer and/or encroachment should be inferred or implied.

Figure 6:
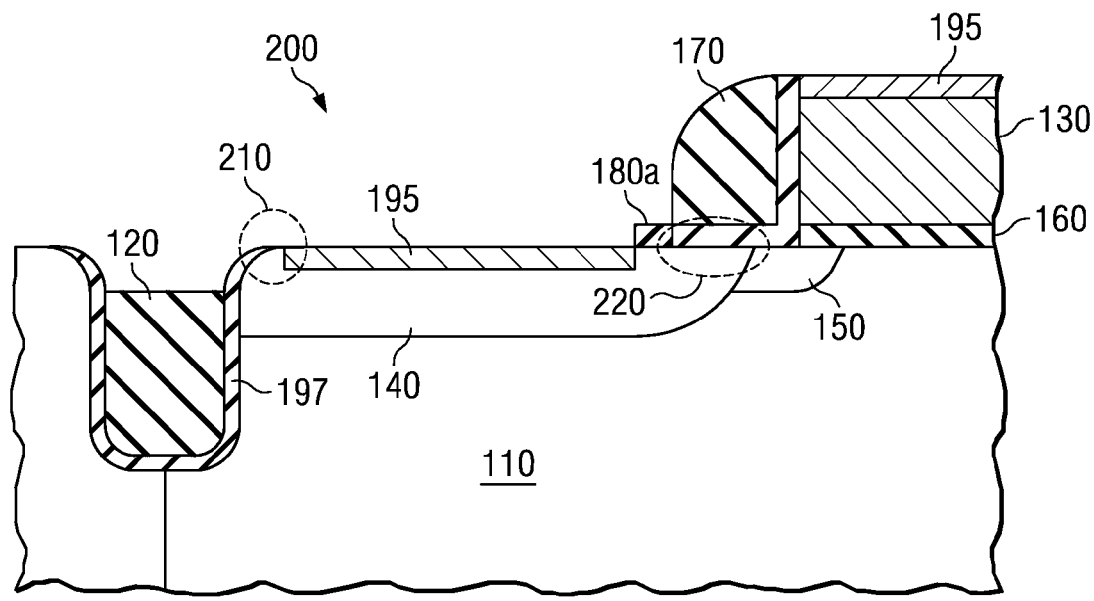
FIG. 6 illustrates a completed semiconductor device after undergoing another embodiment of the disclosed manufacturing process.

FIG. 6 illustrates a completed semiconductor device 200 after undergoing another embodiment of the disclosed manufacturing process. In this embodiment, the remaining protective portion 180a of the protective layer 180 may again be formed proximate to the sidewall spacer 170, similar to the portion 180a described with reference to FIGS. 1-5, although inclusion of this portion 180a is not required. In contrast, the protective portion 197 proximate to the STI structure 120 is different to the prior illustrated portions. Rather than employing the dry etch process to selectively remove some of the protective layer 180, while leaving a protective portion in this area 210, the liner of the STI structure 120 may be used to for the protective portion 197. In conventional processes for forming STI structures 120, an STI liner, such as a nitride liner, is often employed in the trench structure. In accordance with the disclosed principles, this liner may be used as the protective portion 197 formed near the STI structure 120 to help prevent stringer formation. Specifically, during formation, the STI liner may be selectively etched so that a protective portion 197 remains in the area 210 to be protected in accordance with the disclosed principles. Thus, rather than forming a protective portion from a deposited nitride or similar protective layer (e.g., layer 180 above), the protective portion can be formed from a portion of the STI liner by carefully etching the liner such that the protective portion 197 remains where desired. Regardless of whether a protective portion is formed from a separate protective layer or from the STI liner, the protective portion (180 or 197) serves to prevent silicide stringers across the STI structures separating semiconductor devices.

While various embodiments of the disclosed technique have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A semiconductor transistor, comprising:
    a source/drain region formed in a semiconductor substrate adjacent to and extending partially under a sidewall spacer of a gate electrode formed on the substrate;
    an isolation structure formed in the semiconductor substrate at an end of the source/drain region opposite the gate electrode to electrically isolate the transistor;
    a protective portion comprising a protective liner forming substantially all of the sidewall within the isolation structure and extending from within the isolation structure to an upper surface of the source/drain region covering an upper portion of the source/drain region immediately adjacent to a perimeter of the isolation structure; and
    metal silicide formed in the source/drain region, the metal silicide comprising deposited metal reacted with silicon in the source/drain region, wherein the protective portion protects the covered portion of the source/drain region immediately adjacent to the isolation structure from receiving the deposited metal such that no metal silicide forms in the covered portion of the source/drain region.

2. A semiconductor transistor according to claim 1, wherein the protective portion comprises a dielectric material.

3. A semiconductor transistor according to claim 2, wherein the dielectric material comprises nitride, oxide or oxynitride.

4. A semiconductor transistor according to claim 1, further comprising:
    a second protective portion formed on the semiconductor substrate at an intersection between the sidewall spacer and the source/drain region, the second protective portion covering a second portion of the source/drain region not extending under the sidewall spacer; and
    wherein the second protective portion protects the second covered portion of the source/drain region not extending under the sidewall spacer from receiving the deposited metal such that no metal silicide forms at the intersection or in the portion of the source/drain region extending under the sidewall spacer.

5. A semiconductor transistor according to claim 4, wherein the first and second protective portions comprises a dielectric material.

6. A semiconductor transistor according to claim 5, wherein the dielectric material comprises nitride, oxide or oxynitride.

7. A semiconductor transistor according to claim 4, wherein the deposited metal is selected from the group consisting of nickel, cobalt, tungsten, palladium, titanium and tantalum, and the metal silicide comprises nickel silicide, cobalt silicide, tungsten silicide, palladium silicide, titanium silicide and tantalum silicide.

8. A semiconductor transistor according to claim 4, wherein the metal silicide is formed in the source/drain region through an annealing of the semiconductor substrate at about 200-400° C. for about a few seconds to few minutes.

9. A method of manufacturing a semiconductor device layout, the method comprising:
    forming an isolation trench in a semiconductor substrate to electrically isolate a semiconductor transistor formed on the substrate;
    forming a source/drain region in the substrate adjacent to and extending partially under a sidewall spacer of a gate electrode of the semiconductor transistor;
    depositing a non-metal protective layer over the device layout including over substantially all of the sidewall of the trench;
    filling the trench with a dielectric material to form an isolation structure;
    removing areas of the protective layer to form a first protective portion on the substrate at an intersection between the sidewall spacer and the source/drain region, wherein the first protective portion covers a portion of the source/drain region not extending under the sidewall spacer;
    removing areas of the protective layer to form a second protective portion on the semiconductor substrate distinct from the dielectric material filling the trench, the second protective portion extending from within the isolation structure and covering a portion of the source/drain region immediately adjacent to a perimeter of the isolation structure;

depositing a metal layer over the layout;

forming a metal silicide in the source/drain region by reacting the metal layer with silicon in the source/drain region, the first protective portion preventing the metal layer from reacting with the covered portion of the source/drain region not extending under the sidewall spacer such that no metal silicide forms at the intersection or in the portion of the source/drain region extending under the sidewall spacer, and the second protective portion protecting the immediately adjacent covered portion of the source/drain region from the deposited metal such that no metal silicide forms in the immediately adjacent covered portion; and removing non-reacted parts of the metal layer.

10. A method according to claim 9, wherein depositing a protective layer comprises depositing a dielectric layer.

11. A method according to claim 10, wherein the dielectric layer comprises nitride, oxide or oxynitride.

12. A method according to claim 9, wherein removing areas of the protective layer comprises dry etching areas of the protective layer.

13. A method according to claim 9, wherein reacting portions of the metal layer with the source/drain region comprises annealing the semiconductor layout, the method further comprising performing a second anneal on the semiconductor layout after removing the non-reacted portions of the metal layer.

14. A method of manufacturing a semiconductor transistor layout, the method comprising:

forming a source/drain region in a semiconductor substrate adjacent to and extending partially under a sidewall spacer of a gate electrode formed on the substrate;

forming an isolation trench in the semiconductor substrate at an end of the source/drain region opposite the gate electrode to electrically isolate the transistor;

forming a non-metal protective layer over the transistor layout including over substantially all of the sidewall of the trench;

filling the trench with a dielectric material to form an isolation structure;

removing areas of the protective layer to form a first protective portion extending from within the isolation structure to an upper surface of the source/drain region covering an upper portion of the source/drain region immediately adjacent to a perimeter of the isolation structure;

depositing a metal layer over the layout;

forming a metal silicide in the source/drain region by reacting the metal layer with silicon in the source/drain region, the first protective portion protecting the immediately adjacent covered portion of the source/drain region from the deposited metal such that no metal silicide forms in the immediately adjacent covered portion; and removing non-reacted parts of the metal layer.

15. A method according to claim 14, wherein depositing a protective layer comprises depositing a dielectric layer.

16. A method according to claim 15, wherein the dielectric layer comprises nitride, oxide or oxynitride.

17. A method according to claim 14, wherein removing areas of the protective layer comprises dry etching areas of the protective layer.

18. A method according to claim 14, wherein reacting portions of the metal layer with the source/drain region comprises annealing the transistor layout, the method further comprising performing a second anneal on the transistor layout after removing the non-reacted portions of the metal layer.

* * * * *